United States Patent
Toyoshima et al.

(10) Patent No.: US 10,093,854 B2
(45) Date of Patent: Oct. 9, 2018

(54) PHOSPHOR AND LIGHT EMITTING DEVICE

(71) Applicant: Denka Company Limited, Tokyo (JP)

(72) Inventors: Hiroaki Toyoshima, Tokyo (JP); Ryo Yoshimatsu, Tokyo (JP)

(73) Assignee: Denka Company Limited, Tokyo (JP)

( * ) Notice: Subject to any disclaimer, the term of this patent is extended or adjusted under 35 U.S.C. 154(b) by 288 days.

(21) Appl. No.: 15/106,780

(22) PCT Filed: Dec. 22, 2014

(86) PCT No.: PCT/JP2014/083863
§ 371 (c)(1),
(2) Date: Jun. 20, 2016

(87) PCT Pub. No.: WO2015/098814
PCT Pub. Date: Jul. 2, 2015

(65) Prior Publication Data
US 2018/0163128 A1    Jun. 14, 2018

(30) Foreign Application Priority Data
Dec. 26, 2013   (JP) .................................. 2013/269044

(51) Int. Cl.
*C09K 11/79* (2006.01)
*C09K 11/77* (2006.01)
(Continued)

(52) U.S. Cl.
CPC ...... *C09K 11/7734* (2013.01); *C09K 11/0883* (2013.01); *H01L 33/504* (2013.01); *H01L 33/507* (2013.01); *H05B 33/14* (2013.01)

(58) Field of Classification Search
CPC ............ C09K 11/7734; C09K 11/0838; C09K 11/0883
(Continued)

(56) References Cited

U.S. PATENT DOCUMENTS

| | | |
|---|---|---|
| 3,576,756 A | 4/1971 | Russo |
| 6,020,067 A | 2/2000 | Iwama et al. |
| | (Continued) | |

FOREIGN PATENT DOCUMENTS

| | | |
|---|---|---|
| JP | 58089680 | 5/1983 |
| JP | 04178486 | 6/1992 |
| | (Continued) | |

*Primary Examiner* — Christopher Raabe
(74) *Attorney, Agent, or Firm* — Carol L. Francis; Rudy J. Ng; Bozicevic, Field & Francis LLP

(57) ABSTRACT

The present invention relates to a complex oxynitride phosphor which is efficiently excited in the UV to near-UV wavelength region and emits green to yellow light, and a light emitting device using the phosphor. The phosphor according to the present invention is characterized in that it is represented by general formula: $M1_aM2_bRe_cSi_dO_eN_f$; wherein M1 is one or more elements selected from Y, Sc, La, and Al; M2 is one or more elements selected from Zn, Sr, Ba, Ca, and Mg; Re is one or more elements selected from Ce, Pr, Sm, Eu, Dy, Ho, Er, Tm, Yb, Ti, Cr, and Mn among rare-earth elements and transition metal elements; and a, b, c, d, e, and f in the formula satisfy the relationships:

$a+b+c=1$, $0.20<b<0.50$, $0.001<c<0.10$, $2.5<d<4.1$, $0.5<e<1.0$, and $3.5<f<5.6$.

8 Claims, 1 Drawing Sheet

(51) Int. Cl.
  *C09K 11/08* (2006.01)
  *H05B 33/14* (2006.01)
  *H01L 33/50* (2010.01)

(58) Field of Classification Search
  USPC ............................................. 313/503
  See application file for complete search history.

(56) References Cited

U.S. PATENT DOCUMENTS

| | | |
|---|---|---|
| 7,497,973 B2 | 3/2009 | Radkov et al. |
| 8,057,706 B1 | 11/2011 | Setlur |
| 8,491,816 B2 | 7/2013 | Hong et al. |
| 2006/0169998 A1 | 8/2006 | Radkov et al. |
| 2009/0110285 A1 | 4/2009 | Elad et al. |
| 2010/0142189 A1 | 9/2010 | Masuda et al. |
| 2011/0043101 A1 | 2/2011 | Masuda et al. |
| 2011/0058583 A1 | 3/2011 | Fukuda et al. |
| 2012/0104317 A1 | 5/2012 | Nagatomi et al. |
| 2012/0256125 A1 | 10/2012 | Kaneyoshi et al. |
| 2013/0026908 A1 | 1/2013 | Nagatomi et al. |
| 2013/0181164 A1 | 7/2013 | Sohn et al. |
| 2014/0320788 A1 | 10/2014 | Weiler et al. |
| 2015/0061488 A1 | 3/2015 | Yoshida |
| 2016/0060516 A1* | 3/2016 | Sumino ............ C09K 11/7734 252/301.4 F |
| 2017/0009133 A1 | 1/2017 | Emoto et al. |
| 2017/0012181 A1 | 1/2017 | Emoto et al. |
| 2017/0037313 A1* | 2/2017 | Hiroaki ................ H01J 11/42 |

FOREIGN PATENT DOCUMENTS

| | | |
|---|---|---|
| JP | 2009096823 | 5/2009 |
| JP | 2013014715 | 1/2013 |
| JP | 2013177511 | 9/2013 |
| JP | 2013249375 | 12/2013 |
| WO | 2013105345 | 7/2013 |
| WO | 2013105346 | 7/2013 |

* cited by examiner

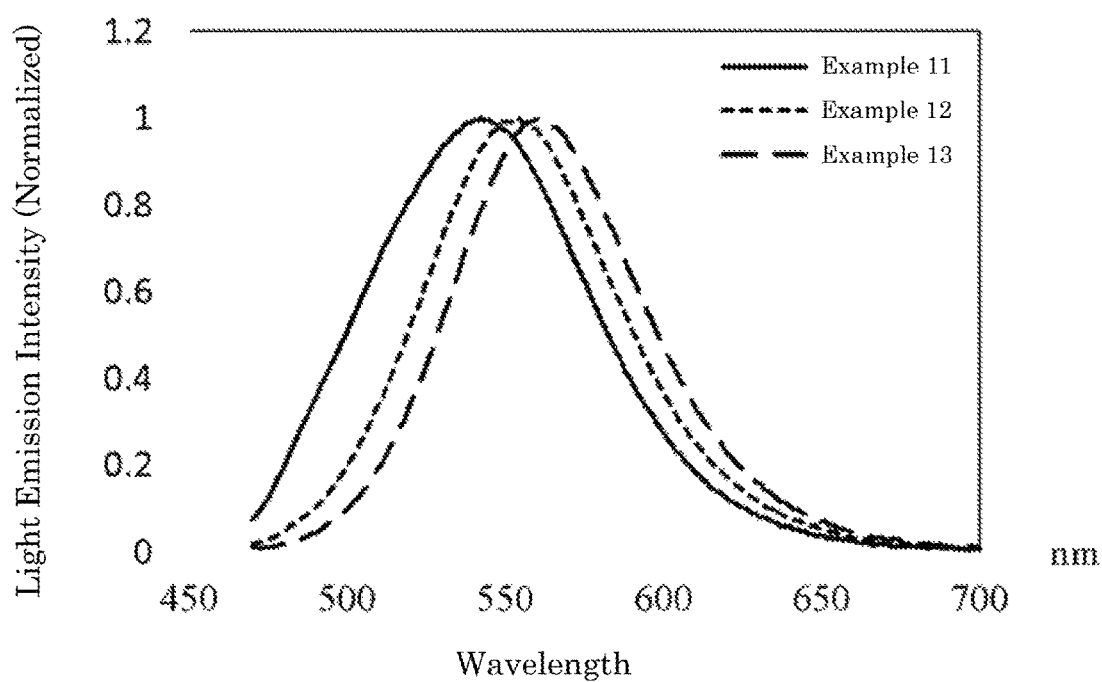

PHOSPHOR AND LIGHT EMITTING DEVICE

TECHNICAL FIELD

The present invention relates to a complex oxynitride phosphor which is efficiently excited in the UV to near-UV wavelength region and emits green to yellow light, and a light emitting device using the phosphor.

BACKGROUND ART

Light emitting devices that combine a semiconductor light emitting element with a phosphor have received interest as next-generation light emitting devices holding the promise of low power consumption, compactness, high luminance and a wide range of color reproducibility, and they are being actively researched and developed. As such phosphors, oxynitride phosphors, which have oxynitrides as a base material and are activated by transition metals or rare earth metals, are widely used for having good light emission properties, thermal stability and chemical stability. As phosphors that are representative of oxynitride phosphors, β-sialon phosphors, α-sialon phosphors and the like are known, and have come into wide practical use.

In order to improve the color rendering and luminance of such light emitting devices, various attempts have been made to improve the light emission properties of oxynitride phosphors.

For example, in consideration of the fact that conventional green and yellow phosphors have low light emission efficiency and are not capable of achieving high-luminance light emissions, Patent Document 1 proposes to limit the composition of an oxynitride phosphor to a specific range, and to construct a chemically stable base structure having sites where Ce or Eu atoms can be easily substituted, thereby obtaining a phosphor that has a wide and flat excitation band, a broad light emission spectrum, and also excellent light emission efficiency.

Additionally, Patent Document 2 describes that a wide range of emitted colors can be obtained, and the crystallinity and light emission efficiency can be improved, by changing the elements and composition ratios contained in oxynitride phosphors.

Furthermore, Patent Document 3 describes that the temperature properties and light emission efficiency can be improved by limiting the composition of an oxynitride phosphor to a specific range.

RELATED ART DOCUMENTS

Patent Documents

Patent Document 1: WO 2006/093298
Patent Document 2: WO 2007/037059
Patent Document 3: WO 2007/105631

SUMMARY OF THE INVENTION

Problems to be Solved by the Invention

However, the ability to efficiently absorb excitation light from a light emission source and emit light is a property that is required in all phosphor applications, not limited to LED applications. For this reason, further improvements are sought for the light emission efficiency of phosphors.

Means for Solving the Problems

As a result of diligent analysis of the crystal structure and optical properties of complex oxynitride phosphors in order to solve the above-described problems, the present inventors discovered that the light emission efficiency can be markedly improved by setting the composition ratio of the elements constituting a phosphor to a specific range, thereby arriving at the present invention.

In other words, the present invention has the purpose of offering a phosphor represented by the general formula: $M1_aM2_bRe_cSi_dO_eN_f$; wherein M1 is one or more elements selected from Y, Sc, La, and Al; M2 is one or more elements selected from Zn, Sr, Ba, Ca, and Mg; Re is one or more elements selected from Ce, Pr, Sm, Eu, Dy, Ho, Er, Tm, Yb, Ti, Cr, and Mn among rare-earth elements and transition metal elements; and a, b, c, d, e, and f in the formula satisfy the relationships:

$a+b+c=1$, $0.20<b<0.50$, $0.001<c<0.10$, $2.5<d<4.1$, $0.5<e<1.0$, and $3.5<f<5.6$.

Additionally, the present invention has the purpose of offering a light emitting device comprising the above-described phosphor and a light emitting element.

Effects of the Invention

The phosphor of the present invention can achieve a higher light emission efficiency than conventional sialon phosphors by controlling the composition ratio of elements constituting the phosphor. Additionally, the light emitting device of the present invention allows a light emitting device with excellent luminance to be obtained by using a phosphor with high light emission efficiency as mentioned above.

BRIEF DESCRIPTION OF THE DRAWINGS

FIG. 1 A diagram showing the light emission spectra of phosphors according to Examples 11, 12 and 13.

MODES FOR CARRYING OUT THE INVENTION

<Phosphor>

The phosphor according to the present invention is represented by the general formula: $M1_aM2_bRe_cSi_dO_eN_f$. This general formula represents the compositional formula for the phosphor, and a to f represent the molar ratios of the elements. Where not indicated otherwise, the composition ratios a, b, c, d, e and f in the present specification represent numerical values computed so that $a+b+c=1$. Needless to say, the molar ratio of the elements when a to f are multiplied by any positive number will yield the same composition formula.

M1 is one or more elements chosen from among Y, Sc, La and Al, and is preferably La.

M2 is one or more elements chosen from among Zn, Sr, Ba, Ca and Mg, and is preferably Ca.

Re is one or more elements chosen from among Ce, Pr, Sm, Eu, Dy, Ho, Er, Tm, Yb, Ti, Cr, and Mn, among rare-earth elements and transition metal elements, and is preferably Eu.

In particular, it is preferable for M1 to comprise La, M2 to comprise Ca and Re to comprise Eu, and it is particularly preferable for M1 to consist only of La, M2 to consist only of Ca, and Re to consist only of Eu. This is believed to be because La and Ca have similar ion radii, so when La and Ca are both present, they form an extremely stable crystal structure.

The composition ratios a, b, c, d, e and f, when calculated so that a+b+c=1, are such that a+b+c=1, $0.20<b<0.50$, $0.001<c<0.10$, $2.5<d<4.1$, $0.5<e<1.0$, and $3.5<f<5.6$.

If the composition ratios a to f lie outside the above-indicated ranges, the light emission efficiency tends to decrease because the crystal structure of the phosphor becomes unstable and the formation of a second phase is promoted.

In particular, if the value c representing the ion concentration of Re which is the light emitting element is too small, the number of atoms of light emitting element ions is insufficient, and sufficient light emission intensity tends not to be obtained for a phosphor. On the other hand, if the value of c is too large, the number of atoms of light emitting element ions becomes excessive, so the light emission intensity tends to be reduced due to a phenomenon known as concentration quenching which is an effect wherein excitation energy is reabsorbed between adjacent light emitting ions. For this reason, the value of c should be in the range of $0.001<c<0.10$, and more preferably in the range of $0.005<c<0.02$.

Additionally, the composition ratio b of M2 should be $0.20<b<0.50$, preferably $0.25<b<0.35$. If the value of b lies outside this range, the crystal structure becomes very unstable, the above-described phosphor is not obtained, and the formation of a second phase tends to be promoted.

Furthermore, the ratio (b/d) of the composition ratio b of M2 with respect to the composition ratio d of Si in the phosphor preferably satisfies the relationship $0.07<b/d<017$. When b/d satisfies this range, high crystallinity is obtained, and the light emission efficiency can be improved.

As the structure of the base crystal of a phosphor, seven crystal systems (cubic crystal system, tetragonal cubic system, orthorhombic crystal system, trigonal crystal system, hexagonal crystal system, monoclinic crystal system, triclinic crystal system) are possible, but by satisfying the above-given conditions, the base crystal of the phosphor becomes monoclinic.

The phosphor according to the present invention has a peak wavelength in the light emission spectrum of 490 to 600 nm, more preferably in the range of 545 to 565 nm, when excited by light having a wavelength of 350 to 480 nm. Since it has a light emission peak near 555 nm where the maximum of standard relative luminous efficiency for photopic vision by humans occurs, it is advantageous for achieving high luminance.

Additionally, the phosphor according to the present invention, aside from satisfying the above-mentioned compositional characteristics, preferably has an average value of diffuse reflectance of 90% or more at wavelengths of 700 to 800 nm, and more preferably 95% or more.

The following reasons can mainly be contemplated as reasons why the light emission efficiency can be improved by controlling the diffuse reflectance in the above-described wavelength region to be in a predetermined range.

Since light emission by phosphors occurs due to electron transitions of Re ions which form the light emission centers, the light emission efficiency from the light emission centers generally increases as the absorption due to the base crystal is reduced and the transmittance of light becomes higher. Because the diffuse reflectance is reduced by the absorption of light during the process of light diffusion in the phosphor powder, a high diffuse reflectance means that the transmittance of light is high.

Since a phosphor represented by the general formula $M1_aM2_bRe_cSi_dO_eN_f$ as in the present invention is excited by light in the range of 300 to 500 nm, the diffuse reflectance in the light emission region of wavelengths higher than 700 nm represents absorption by substances other than the Re in the phosphor, in other words, absorption by the base crystal. Additionally, if the crystallinity is low, the defect concentration in the crystal increases, the absorption due to the base crystal increases, and the diffuse reflectance in the above-indicated region is reduced. For this reason, it is thought that as the average diffuse reflectance at wavelengths of 700 to 800 nm becomes higher, there is less absorption by the base crystal, so the light extraction efficiency is superior.

The diffuse reflectance is closely connected to the presence of crystal defects, second phases and impurities that absorb visible light in the phosphor, and by reducing these, can be controlled to be in the above-described range. For example, when producing a phosphor, crystal defects and second phases can be reduced by performing annealing treatments or acid treatments, so the diffuse reflectance can be improved by performing these steps.

The phosphor of the present invention can be produced in accordance with a general production method for oxynitride phosphors, comprising a mixing step of mixing the raw materials, and a sintering step of sintering the raw materials after the mixing step. Additionally, as mentioned above, the sintering step is preferably followed by an annealing treatment or acid treatment.

<Light Emitting Device>

The light emitting device of the present invention includes a light emitting element and the phosphor of the present invention. This light emitting device may be used in combination with one or more phosphors other than the present invention in accordance with the luminance or color rendering ability required of the light emitting device.

The light emitting element is an inorganic light emitting element or an organic light emitting element that emits light at a wavelength of 350 to 480 nm. The light emitting element is preferably a laser diode element or an LED element. If the light emission wavelength of the light emitting element is too small, the energy of the light emitting element is easily converted to heat and this leads to increased power consumption. On the other hand, if the light emission wavelength is too large, the conversion efficiency of the phosphor becomes lower.

The light emitting device can be a backlight for a monitor, a light source device for a projector, a video display device, an illumination device, a traffic signal, or a road marker etc.

EXAMPLES

The present invention will be explained in further detail by means of the examples indicated below. Table 1 shows the composition ratios, diffuse reflectances and relative light emission efficiencies of phosphors according to the examples and comparative examples.

TABLE 1

|  |  | Comp. Ex. 1 | Ex. 1 | Ex. 2 | Ex. 3 | Ex. 4 | Ex. 5 | Ex. 6 |
|---|---|---|---|---|---|---|---|---|
| Phosphor Composition | M1 | La | La | La | La | La | La | La |
|  | M2 | Ca | Ca | Ca | Ca | Ca | Ca | Ca |
|  | Re | Eu | Eu | Eu | Eu | Eu | Eu | Eu |
|  | a | 0.670 | 0.660 | 0.663 | 0.664 | 0.660 | 0.661 | 0.772 |
|  | b | 0.320 | 0.330 | 0.327 | 0.326 | 0.330 | 0.329 | 0.219 |
|  | c | 0.010 | 0.010 | 0.010 | 0.010 | 0.010 | 0.010 | 0.009 |
|  | d | 4.60 | 4.10 | 3.70 | 3.30 | 3.00 | 2.80 | 2.90 |
|  | e | 0.80 | 0.80 | 0.80 | 0.80 | 0.80 | 0.80 | 0.80 |
|  | f | 6.60 | 5.60 | 4.90 | 4.50 | 4.20 | 3.90 | 4.20 |
|  | b/d | 0.0696 | 0.0805 | 0.0884 | 0.0987 | 0.1100 | 0.1175 | 0.0755 |
| Raw Material | $La_2O_3$ | 3.484 | 3.714 | 3.902 | 4.076 | 4.227 | 4.006 | 4.912 |
|  | CaO | 1.175 | 1.250 | 1.316 | 1.375 | 1.426 | 1.352 | 1.099 |
|  | $Si_3N_4$ | 6.000 | 5.800 | 5.600 | 5.400 | 5.200 | 4.600 | 4.700 |
|  | $Eu_2O_3$ | 0.075 | 0.080 | 0.084 | 0.088 | 0.091 | 0.087 | 0.088 |
| Average diffuse reflectance (%) at wavelength 700-800 nm |  | 93 | 93 | 94 | 94 | 94 | 96 | 94 |
| Relative Light Emission Efficiency (%) |  | 100 | 107 | 111 | 119 | 124 | 139 | 120 |

|  |  | Ex. 7 | Ex. 8 | Ex. 9 | Ex. 10 | Ex. 11 | Ex. 12 | Ex. 13 |
|---|---|---|---|---|---|---|---|---|
| Phosphor Composition | M1 | La | La | La | La | La | La | La |
|  | M2 | Ca | Ca | Ca | Ca | Ca | Ca | Ca |
|  | Re | Eu | Eu | Eu | Eu | Eu | Eu | Eu |
|  | a | 0.729 | 0.609 | 0.564 | 0.500 | 0.666 | 0.660 | 0.661 |
|  | b | 0.262 | 0.381 | 0.426 | 0.490 | 0.329 | 0.325 | 0.319 |
|  | c | 0.009 | 0.010 | 0.010 | 0.010 | 0.005 | 0.015 | 0.020 |
|  | d | 2.90 | 2.70 | 2.90 | 2.90 | 2.90 | 3.00 | 3.00 |
|  | e | 0.80 | 0.70 | 0.70 | 0.80 | 0.70 | 0.70 | 0.70 |
|  | f | 4.10 | 3.90 | 3.90 | 4.20 | 3.90 | 3.70 | 4.00 |
|  | b/d | 0.0903 | 0.1412 | 0.1467 | 0.1690 | 0.1136 | 0.1082 | 0.1062 |
| Raw Material | $La_2O_3$ | 4.503 | 3.919 | 3.623 | 3.231 | 4.181 | 4.006 | 4.006 |
|  | CaO | 1.240 | 1.619 | 1.840 | 2.034 | 1.436 | 1.365 | 1.324 |
|  | $Si_3N_4$ | 4.700 | 5.000 | 5.200 | 5.300 | 4.800 | 4.600 | 4.600 |
|  | $Eu_2O_3$ | 0.088 | 0.094 | 0.098 | 0.100 | 0.009 | 0.043 | 0.173 |
| Average diffuse reflectance (%) at wavelength 700-800 nm |  | 95 | 95 | 93 | 93 | 95 | 95 | 95 |
| Relative Light Emission Efficiency (%) |  | 127 | 129 | 124 | 103 | 119 | 131 | 118 |

Example 1

1. Production of Phosphor

The phosphor of Example 1 was produced by the following method.

As the raw materials, lanthanum oxide ($La_2O_3$), calcium oxide (CaO), silicon nitride ($Si_3N_4$) and europium oxide ($Eu_2O_3$) were used. The raw materials were weighed out as in Table 1, then dry-mixed for 30 minutes using an agate mortar and pestle. The numerical values in the raw materials columns of Table 1 are indicated by weight (grams) of the raw materials.

After dry-mixing, the raw materials were loaded into a boron nitride crucible, which was sealed by a lid consisting of the same material as the crucible, and set in an electric furnace with a carbon heater and baked. Nitrogen gas was used for the atmosphere inside the electric furnace. The inside of the electric furnace was held in a high vacuum state using a rotary pump at room temperature, and upon the temperature inside the furnace reaching 300° C., the nitrogen gas was introduced to atmospheric pressure.

The baked product was manually crushed using an agate mortar and pestle. The powder obtained after crushing was immersed in a strongly acidic liquid to dissolve away impurities, resulting in the phosphor of Example 1.

2. Confirmation of Crystal Phase

The crystal phases of the phosphor of Example 1 were identified by X-ray diffraction measurements. As the measuring device, Ultima-IV, manufactured by Rigaku, equipped with a Cu Kα tube was used. The phosphor powder had a single crystal phase with a monoclinic crystal system, and there were no other crystal phases.

3. Average Value of Diffuse Reflectance at Wavelengths of 700 to 800 nm

The diffuse reflectance of the phosphor was measured in accordance with JIS P 8152:2005 "Paper, board and pulps—Measurement of diffuse reflectance factor". Using a Spectralon diffuse reflectance panel SRT-99-020 manufactured by Labsphere as a standard white panel, a phosphor sample was loaded into a cell, and measurements were made using a UV/visible spectrophotometer V-550, manufactured by JASCO, equipped with an ISV-469 integrating sphere.

The average values of the diffuse reflectance at wavelengths of 700 to 800 nm in Table 1 were calculated by taking the average values of the diffuse reflectance at wavelengths of 700 to 800 nm among the values of diffuse reflectance in the range of wavelengths of 500 to 800 nm obtained by these measurements.

4. Relative Light Emission Efficiency

Light having a wavelength of 455 nm obtained by separating the light emitted from an Xe lamp using a spectroscope was used as an excitation beam. Using an optical fiber, this excitation beam was shone onto a phosphor sample set inside an integrating sphere, and the light emissions from the phosphor due to the excitation beam were used to determine the light emission efficiency using an instant multi-photometric system (high-sensitivity type) MCPD-7000 manufactured by Otsuka Electronics. The relative light emission efficiency was determined as a relative value when considering the light emission efficiency of the phosphor of the below-described Comparative Example 1 to be 100%.

The composition of the phosphor of Example 1, as shown in Table 1, was a phosphor of $La_{0.660}Ca_{0.330}Eu_{0.010}Si_{4.10}O_{0.80}N_{5.60}$. The phosphor of Example 1 had an average value of diffuse reflectance of 93% at wavelengths of 700 to 800 nm, and a relative light emission efficiency of 107%.

Comparative Example 1

Comparative Example 1 was produced in the same manner as Example 1 except that the elemental composition was as shown in Table 1. The phosphor of Comparative Example 1 was $La_{0.670}Ca_{0.320}Eu_{0.010}Si_{4.60}O_{0.80}N_{6.60}$. For the phosphor of Comparative Example 1, the values of d, f and b/d were outside the range defined by the present invention, and while the average value of the diffuse reflectance at wavelengths of 700 to 800 nm was high, the light emission efficiency was not adequate.

Examples 2-13

Examples 2-13 were produced in the same manner as Example 1 except that the elemental compositions were as shown in Table 1. All of the examples exhibited higher average diffuse reflectance and relative light emission efficiency than the phosphor of Comparative Example 1.

FIG. 1 shows the light emission intensities when using light having a wavelength of 455 nm obtained by separating the light emitted from an Xe lamp using a spectroscope as an excitation beam, using an optical fiber to shine this excitation beam onto the phosphors of Examples 11, 12 and 13 set inside an integrating sphere, and observing the light emissions of the phosphors due to the excitation beams using an instant multi-photometric system (high-sensitivity type) MCPD-7000 manufactured by Otsuka Electronics. The numerical values of the light emission intensities are normalized so that the maximum light emission intensity is 1. It was confirmed that, even when changing the concentration of Eu which is the light emission center ion, a high light emission intensity is maintained and the light emission peak wavelength continuously shifts.

Additionally, while not described in Table 1, it was confirmed that high light emission efficiency as with Example 1 is obtained even when using Y, Sc or Al as M1 instead of La, using Zn, Sr, Ba or Mg as M2 instead of Ca, and using Ce, Pr, Sm, Eu, Dy, Ho, Er, Tm, Yb, Ti, Cr or Mn as Re instead of Eu, as compared with the phosphor of Example 1.

Example 14

A light emitting device was produced using the phosphor of Example 1 mixed into a sealing material, and a light emitting diode that emits light having a wavelength of 455 nm as the light emitting element. This light emitting device exhibited higher luminance than a light emitting device produced in a similar manner using the phosphor of Comparative Example 1.

The invention claimed is:

1. A phosphor represented by general formula: $M1_aM2_bRe_cSi_dO_eN_f$; wherein M1 is one or more elements selected from Y, Sc, La, and Al; M2 is one or more elements selected from Zn, Sr, Ba, Ca, and Mg; Re is one or more elements selected from Ce, Pr, Sm, Eu, Dy, Ho, Er, Tm, Yb, Ti, Cr, and Mn among rare-earth elements and transition metal elements; and a, b, c, d, e, and f in the formula satisfy the relationships:

$a+b+c=1$, $0.20<b<0.50$, $0.001<c<0.10$, $2.5<d<4.1$, $0.5<e<1.0$, and $3.5<f<5.6$.

2. The phosphor according to claim 1, wherein a base crystal is a monoclinic crystal system.

3. The phosphor according to claim 1, wherein b and d satisfy the condition $0.07<b/d<0.17$.

4. The phosphor according to claim 1, wherein M1 comprises La, M2 comprises Ca, and Re comprises Eu.

5. The phosphor according to claim 1, wherein a peak wavelength in the light emission spectrum is 490 to 600 nm, when excited by light having a wavelength of 350 to 480 nm.

6. The phosphor according to claim 1, wherein an average value of diffuse reflectance at wavelengths of 700 to 800 nm is 90% or more.

7. A light emitting device comprising the phosphor according to claim 1, and a light emitting element.

8. The light emitting device according to claim 7, wherein the light emitting element emits light having a wavelength of 350 to 480 nm.

* * * * *

UNITED STATES PATENT AND TRADEMARK OFFICE
CERTIFICATE OF CORRECTION

PATENT NO. : 10,093,854 B2  
APPLICATION NO. : 15/106780  
DATED : October 9, 2018  
INVENTOR(S) : Hiroaki Toyoshima Page 1 of 1

It is certified that error appears in the above-identified patent and that said Letters Patent is hereby corrected as shown below:

On the Title Page

In the Abstract, Line 12, "c, d, e, and fin" should read -- c, d, e, and f in --

In the Specification

At Column 2, Line 59, "ratios a, b, c, d, e and fin" should read -- ratios a, b, c, d, e and f in --

In the Claims

At Column 8, Line 21, "and a, b, c, d, e, and fin" should read -- and a, b, c, d, e, and f in --

Signed and Sealed this  
Twenty-ninth Day of January, 2019

Andrei Iancu  
*Director of the United States Patent and Trademark Office*